Sept. 14, 1965 H. H. MEURER 3,206,682
TRANSISTOR MIXER AND OSCILLATOR CIRCUIT
Filed July 19, 1962
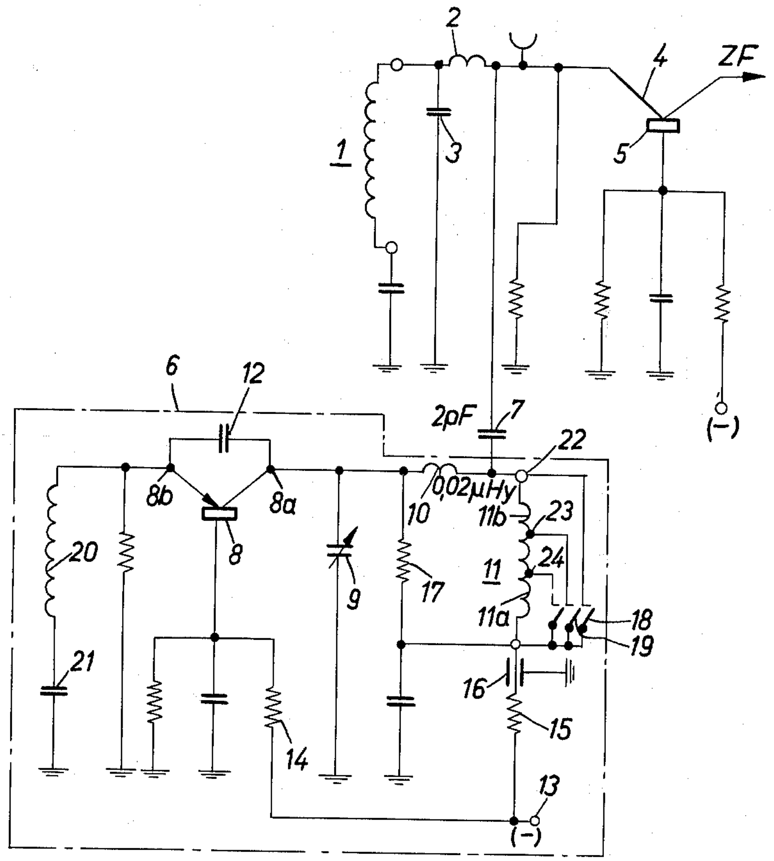
Inventor:
[signature]

United States Patent Office 3,206,682

Patented Sept. 14, 1965

3,206,682

TRANSISTOR MIXER AND OSCILLATOR CIRCUIT

Heinz H. Meurer, Kronach, Upper Franconia, Germany, assignor to Loewe Opta A.G., Berlin-Steglitz, Berlin, Germany, a company of Germany Filed July 19, 1962, Ser. No. 211,484

Claims priority, application Germany, July 26, 1961, L 39,639

1 Claim. (Cl. 325—438)

The invention relates to a mixer and oscillator circuit and more particularly to a transistor mixer and oscillator stage used in TV tuners. A tuner of a television receiver usually comprises one or several R-F amplifier stages amplifying the received R-F signal, and a mixer stage, furthermore an oscillator stage.

In exclusively transistorized television tuners particular measures are necessary to modulate the mixer of the tuner with an oscillator voltage of maximum constancy. Here the fact must be considered that not only the relatively wide receiving frequency range of a television tuner but also the different operating data of the transistors used and fluctuations of supply voltage reduce both the constancy of frequency and voltage of a transistorized oscillator and also the receiver's safety factor against interfering-radiations.

The object of the invention is therefore to develop a simple and effective circuit arrangement to stabilize the voltage and frequency of an oscillator in transistorized television tuners.

According to the invention such stabilization is achieved by providing a transistor mixer and oscillator circuit in a channel-selector of a television receiver, said oscillator comprising a parallel tuned tank circuit, a series tuned tank circuit, and a transistor having an emitter, a collector and a base, said base being grounded via a resistor which is shunted by a capacitor, said base being furthermore connected via a bias resistor to a source of negative potential, said emitter and said collector being shunted by a capacitor, said emitter being connected to said series tuned tank circuit, said collector being connected to said parallel tuned tank circuit consisting of a variable capacitor coupled between said collector and ground, a resistor in series with a capacitor coupled between collector and ground, a main coil in series with several additional coils, and a resistor, all coupled between said collector and said source of negative potential, all or individual of said additional coils can be shunted by lines of small self-inductions, and a tapping between said main coil and said additional coils being connected via a fixed capacitor to an input of said mixer circuit.

Further details of the invention are explained with reference to the accompanying drawing showing a tuner circuit for the television channels I and III, which is merely an exemplary design:

A transistorized television tuner contains on the input side one or several R-F amplifier stages (not illustrated) which over a band filter 1 and a LC-network 2, 3 is or are connected to the emitter 4 of a mixing transistor 5 working in grounded base arrangement. The oscillator frequency which is to be mixed with the received high frequency is produced in a transistorized oscillator 6 and coupled over a condenser 7 to the emitter 4 of the mixing transistor 5.

The oscillator 6 contains a transistor 8 working in grounded arrangement, which transistor's collector circuit is characterized by a parallel tuned tank circuit defining the oscillator frequency, which parallel resonant circuit is substantially formed by a variable capacitor 9 and induction coils 10 and 11 connected in series. The collector connection 8a and emitter connection 8b are shunted by a capacitor 12 which causes a reaction coupling generating oscillations.

The direct current voltage for the oscillator transistor 8 is tapped from a negative pole 13 of a feed voltage source, and over a bias resistor 14 of the transistor base and over resistor 15, a bushing type capacitor 16 and resistor 17 damping the parallel tuned tank circuit and being connected in parallel with coils 10 and 11 fed to the collector of the transistor.

To produce stabilization of the oscillator frequency and oscillator voltage with a view to achieving optimum mixing amplification and freedom from interference radiation, coil 11 can be short-circuited in two or several stages (tappings 22, 23 and 24). Instead of a tapped coil 11 several coils which can be cut in singly may be provided. The short-circuiting of the entire coil 11 or a part of this coil, e.g. 11a, occurs simultaneously with channel selection, whereby according to the channel set one of the operating contacts 18 or 19 is closed. Where e.g. with the tuner the highest channel frequency is set, contact 18, then closed, bridges the entire coil 11, and only the main coil is retained as frequency-defining inductivity. Where a channel below the highest frequency is selected, e.g. the adjacent one, contact 19 is closed, which simultaneously re-opens contact 18. In this case main coil 10 and coil-part 11b are effective.

The coil parts jumpered by the switch contacts or eventually by a shorting bar become smaller with lessening channel numbers and/or smaller channel frequency, so that with the smallest channel frequency the inductivity of the entire coil 11 becomes effective.

In the emitter circuit of transistor 8 a series tuned tank circuit is provided consisting of an induction coil 20 and a capacitor 21, which circuit automatically in dependence on the particular oscillator-frequency corrects the phase relationship at transistor 8. Correction is necessary in particular at the lower and upper limit of the received frequency band (e.g. lower limit 50 mc./s. at band I and upper limit 225 mc./s. at band III). The resonance frequency of the series tuned tank circuit lies at about the middle of the frequency band (at 120 mc./s.) so that the said circuit is effective below the resonance frequency as additional capacity (21) and above as inductivity (20).

With appropriate selection of the coil tapping 22, 23 and 24 associated with the individual frequency channels and of the frequency-dependent resistance 7 (coupling condenser) a largely constant oscillator voltage is produced over the entire received frequency range. Simultaneously frequency stabilization occurs in the event of supply voltage fluctuations, which at a voltage change of $\pm 10$ percent only results in a frequency deviation of approximately $\pm 50$ kc./s., contrary to the conventional tube tuners, whose frequency at the same voltage change fluctuates by about $\pm 150$ kc./s.

The circuit arrangement according to the invention is not restricted to the design example of the television tuner for bands I to III but can also—with appropriate dimensioning—be used for the UHF bands.

What I claim is:

A transistor mixer and oscillator circuit in a channel-selector of a television receiver, said oscillator comprising a parallel tuned tank circuit, a series tuned tank circuit, and a transistor having an emitter, a collector and a base, said base being grounded via a resistor which is shunted by a capacitor, said base being furthermore connected via a bias resistor to a source of negative potential, said emitter and said collector being shunted by a capacitor, said emitter being connected to said series tuned tank circuit, said collector being connected to said parallel tuned tank circuit consisting of a variable capacitor coupled between said collector and ground, a resistor in series with a capacitor coupled between collector and ground, a main coil in series with several additional coils and a resistor, all coupled between said collector and said source of negative potential, all or individual of said additional coils can be shunted by lines of small self-inductance, and a tapping between said main coil and said additional coils being connected via a fixed capacitor to an input of said mixer circuit.

References Cited by the Examiner

UNITED STATES PATENTS

| | | | |
|---|---|---|---|
| 2,812,436 | 11/57 | Overbeek | 331—117 |
| 2,853,613 | 9/58 | Nilssen | 331—179 |

DAVID G. REDINBAUGH, *Primary Examiner.*